United States Patent [19]

Uenishi

[11] Patent Number: 5,140,201

[45] Date of Patent: Aug. 18, 1992

[54] GATE DRIVE CIRCUIT FOR INSULATED GATE SEMICONDUCTOR DEVICE AND FLASH CONTROLLER USING THE CIRCUIT

[75] Inventor: Akio Uenishi, Fukuoka, Japan

[73] Assignee: Mitsubishi Denki Kabushiki Kaisha, Tokyo, Japan

[21] Appl. No.: 672,072

[22] Filed: Mar. 19, 1991

[30] Foreign Application Priority Data

Apr. 2, 1990 [JP] Japan .................. 2-88617

[51] Int. Cl.⁵ ............................ H03K 17/687
[52] U.S. Cl. ............................ 307/571; 307/300
[58] Field of Search .......... 307/300, 571, 253, 262; 315/241 R; 354/416

[56] References Cited

U.S. PATENT DOCUMENTS

| | | | |
|---|---|---|---|
| 4,032,851 | 6/1977 | Hoover | 307/304 |
| 4,461,966 | 7/1984 | Hebenstreit | 307/571 |
| 4,491,744 | 1/1985 | Grey | 307/570 |
| 4,687,971 | 8/1987 | Shimizu | 315/241 R |
| 4,794,274 | 12/1988 | Lôhn | 307/300 |
| 4,839,686 | 6/1989 | Hosomizu et al. | |
| 4,873,460 | 10/1989 | Rippel | 307/571 |
| 4,967,109 | 10/1990 | Steigerwald | 307/571 |
| 4,970,439 | 11/1990 | Stopa | 315/241 R |

*Primary Examiner*—Eugene R. Laroche
*Assistant Examiner*—A. Zarabian
*Attorney, Agent, or Firm*—Oblon, Spivak, McClelland, Maier & Neustadt

[57] ABSTRACT

A gate drive circuit comprises first and second reverse-blocking switches, each composed of a serially connected transistor (101, 102) and diode (105, 106), which are connected in series between a gate drive power source ($V_{GG}$) and a ground for switching a gate drive current of an insulated gate semiconductor device (3). An inductance element (108) are provided between the junction point of the first and second reverse-blocking switches and the gate of the insulated gate semiconductor device (3) to induce LC resonance by the inductance of the element (108) and the gate input capacitance of the insulate gate semiconductor device (3). Thus, both small peak switching current of the switches and high speed switching of the semiconductor device (3) can be attained. Further, a flash controller can be reduced in its size and cost by using the above gate drive circuit for on/off driving an insulated gate semiconductor device inserted in a flash main circuit.

16 Claims, 16 Drawing Sheets

GATE DRIVE CIRCUIT FOR INSULATED GATE SEMICONDUCTOR DEVICE AND FLASH CONTROLLER USING THE CIRCUIT

BACKGROUND OF THE INVENTION

1. Field of the Invention

The present invention relates to an improvement on a gate drive circuit for on-and-off-driving an insulated gate semiconductor device such as a power MOSFET, an IGBT (insulated gate bipolar transistor) and a MOSGTO and to a flash controller for photography etc. using the improved gate drive circuit.

2. Description of the Background Art

The type of gate drive circuit which has been conventionally used is shown in FIG. 9. Hereinafter described is the structure of the conventional gate drive circuit based on the example of FIG. 9. In FIG. 9, numeral 100 designates a gate drive circuit for receiving a control input $V_1$, which comprises two switching transistors 101 and 102 connected in series between a gate drive power source $V_{GG}$ and the ground, a gate resistor 110 connected between an output terminal and a midpoint of the connection between the two switching transistors 101 and 102, and logical circuits 103 and 104 for controlling the two switching transistors 101 and 102 by the control input $V_1$. An output from the gate drive circuit 100 is connected to a portion between gate and source of a power MOSFET 3 which is one type of insulated gate semiconductor devices. The power MOSFET 3 constitutes a main circuit in cooperation with a load 4 and a power source 5.

FIG. 10 shows operating waveforms of the gate drive circuit 100 of FIG. 9. Referring to this waveform chart, an operation of the conventional gate drive circuit is explained hereinafter. Responsive to the control input $V_1$, the logical circuits 103 and 104 turn on/off the switching transistors 101 and 102 complementarily, respectively. When the control input $V_1$ is low, the switching transistor 101 is off and the switching transistor 102 is on. Accordingly, a midpoint voltage $v_2$ of the two switching transistors 101 and 102 is low ($V_{2L}$), and a gate voltage $v_G$ of the power MOSFET 3 is constrained at a low level ($V_{GL}$) which is substantially equal to the ground level. When the control input $V_1$ is high, the switching transistor 101 is on and the switching transistor 102 is off. Accordingly, the midpoint voltage $v_2$ of the two switching transistors 101 and 102 is a high level ($V_{2H}$) which is substantially equal to $V_{GG}$. By virtue of this high level, a gate current $i_G$ is supplied through the gate resistor 110 to the gate of the power MOSFET 3.

As for the power MOSFET 3, the gate thereof has capacitance characteristics, as is well-known. When a gate-source capacitance $C_{GS}$ and a gate-drain capacitance $C_{GD}$ are charged, the gate voltage $v_G$ is increased. The capacitance $C_{GD}$ of the power MOSFET 3 varies widely according to the voltages of gate and drain and carries out considerably complicated charging and discharging operations, partially caused by Miller effect. For easy analysis, the capacitance $C_{GD}$ is treated on the assumption that it is so large as to be equivalent to the capacitance $C_{GS}$ and has a gate input capacitance which is a constant value $C_{iss}$ in parallel to the capacitance $C_{GS}$. By virtue of such simplification, gate voltage increase of the power MOSFET 3 can be approximated by an exponential waveform having a time constant ($\tau = R \cdot C_{iss}$) which is the product of a resistance value R of the gate resistor 110 and $C_{iss}$ of the power MOSFET 3.

In the power MOSFET 3, provided that a drain current $i_D$ starts to flow when the gate voltage $v_G$ exceeds $V_{GS(OFF)}$ and the drain current (or a load current) $i_D$ having a current value $I_D$ can flow when the gate voltage $v_G$ is equal to $V_{GS(ON)}$, the drain current $i_D$ can vary from O to $I_D$ while the gate voltage $v_G$ is increased from $V_{GS(ON)}$. If this period of time is defined as rise time $t_r$, $$t_r = R \cdot C_{iss} \ln\left(\frac{V_{GG} - V_{GS(OFF)}}{V_{GG} - V_{GS(ON)}}\right) \quad (1)$$

is obtained. For example, if R=10Ω, $C_{iss}$=10 nF, $V_{GG}$=10 V, $V_{GS(OFF)}$=2V, and $V_{GS(ON)}$=8V, $$t_r = 100^n \times \ln\left(\frac{8}{2}\right) = 139 \text{ ns}. \quad (2)$$

This charging characteristic is shown by the example of non-resonance in FIGS. 11(a) and (b). The gate voltage $v_G$ rises up to $V_{GH}$ which is substantially equal to the gate drive power source voltage $V_{GG}$ with the passage of time. Thereafter, when the control input $V_1$ is switched to the low level, the gate input capacitance $C_{iss}$ of the MOSFET 3 which has been charged is discharged through the gate resistor 110 and the switching transistor 102, and the gate voltage $v_G$ is decreased. The decrease characteristic at this time is also indicated by the exponential function having the time constant $\tau = R \cdot C_{iss}$ and has fall time $t_f$ expressed by the same equation as Equation (1).

FIG. 12 is a circuit diagram showing a conventional flash controller using the gate drive circuit of FIG. 9. In FIG. 12, numeral 1 designates a high voltage power source (though, in practice, the voltage of a battery is often increased by a DC-DC converter), 2 designates a main capacitor charged by the high voltage power source 1, 6 designates an IGBT which is one type of the insulated gate semiconductor devices, 7 designates a flash discharge tube, 100 designates the gate drive circuit having the same constitution as FIG. 9 for on-and-off-driving the IGBT 6, and 200 designates a trigger circuit. The IGBT 6 and the flash discharge tube 7 are connected in series to each other, and this series connected body is connected to the main capacitor 2 in parallel. The trigger circuit 200 comprises a trigger transformer 8, a trigger capacitor 9 and a charging resistor 10. Trigger pulse energy is supplied to the trigger circuit 200 according to the variation of a collector voltage of the IGBT 6.

Referring now to a waveform chart of FIG. 13, an operation is explained hereinafter. The control input $V_1$ is low. A voltage of about 30 V is applied to the gate drive power source $V_{GG}$, and a voltage of about 300 V is applied to the high voltage power source 1. The gate voltage $v_G$ of the IGBT 6 is held at about the ground level because the switching transistor 101 is off and the switching transistor 102 is on. The collector voltage of the IGBT 6 is charged up to about 300 V as well as the trigger capacitor 9 by the charging resistor 10 in the trigger circuit 200.

In such a state, when the control input $V_1$ is switched to a high level, the switching transistor 101 is turned on and the switching transistor 102 is turned off. Accordingly, the gate input capacitance $C_{iss}$ is charged by the gate drive power source $V_{GG}$ through the switching transistor 101 and the gate resistor 110, thereby the gate voltage $v_G$ of the IGBT 6 being increased. When the gate voltage $v_G$ is increased up to a value by which the IGBT 6 can be turned on enough, the collector voltage of the IGBT 6 is decreased rapidly, and the trigger capacitor 9 which has been charged is discharged through a primary winding of the trigger transformer 8 to the collector of the IGBT 6, thereby a high voltage pulse of several KV being generated at a secondary winding of the trigger transformer 8. The gate of the flash discharge tube 7 is thus triggered and the flash discharge tube 7 conducts. The main capacitor 2 which has been charged is discharged through the flash discharge tube 7 and the IGBT 6, and flash discharge starts.

Thereafter, when the flash amount required for photography etc. is obtained and then the control input $V_1$ is switched to the low level again, the switching transistor 101 is turned off and the switching transistor 102 is turned on. Accordingly, the gate input capacitance $C_{iss}$ of the IGBT 6 which has been charged is discharged through the gate resistor 110 and the switching transistor 102. When the gate voltage $v_G$ of the IGBT 6 is decreased to be lower than the voltage by which the IGBT 6 can hold on-state, a collector current $i_c$ starts to be decreased. Thereafter the collector current $i_c$ of the IGBT 6 is decreased with the decreasing gate voltage $v_G$, and finally the IGBT 6 is turned off. Thereby the flash emission of the flash discharge tube 7 is terminated. The desired amount of light required for photography etc. can be thus obtained by controlling the conducting period. For flash control by the IGBT 6, it is necessary to treat a large current of 100–200 A peak in a practical flash discharge tube. For the achievement in an economical device, the gate voltage must be considerably higher than that of other applications.

In the conventional gate drive circuit 100 of FIG. 9, since the gate input capacitance $C_{iss}$ of the power MOSFET 3 is charged and discharged by the gate resistor 110, the output voltage thereof varies merely exponentially between the ground and $V_{GG}$. For high-speed drive of the power MOSFET 3, the resistance of the gate resistor 110 must be small. Accordingly the peak value ($I_{GP1} \approx I_{GP2} = V_{GG}/R$) of the current which flows through the switching transistors 101 and 102 grows large. As a result, the switching transistors 101 and 102 with large current capacitances must be used, and the circuit is difficult to be integrated. In addition, switching losses of the switching transistors 101 and 102 increase, and driver losses are liable to increase. When a current for charging and discharging the gate input capacitance $C_{iss}$ of the power MOSFET 3 is conducted, the gate resistor 110 generates a power loss $P_d$ indicated by Equation (3).

$$P_d = f \cdot C_{iss} \cdot V_{GG}^2 \qquad (3)$$

For example, when f=1 MHz, $C_{iss}$=10 nF and $V_{GG}$=10 V, Pd=1 W is obtained, which is too large to be disregarded as driver losses.

On the other hand, in the conventional flash controller shown in FIG. 12, a high voltage (about 30 V in current devices) capable of sufficiently driving the IGBT 6 in on-state is required for the gate drive power source $V_{GG}$. In general, a flash device for a camera has a 3–6 V power source of a battery and a high voltage power source of about 300 V obtained by increasing the voltage of the 3–6 V power source by means of the DC-DC converter, as power sources. However, the device does not have a power source of about 30 V suitable for driving the gate of the IGBT 6. Such a power source must be produced as a separate circuit. Many current AF cameras contain 12 V power sources for CCD driving. In such cases, it is possible to control a current of about 130 A by directly driving the IGBT by means of the 12 V power source if the IGBT with a low gate drive voltage is used.

Conventionally, the separate power source $V_{GG}$ of about 30 V has been normally produced by making a tap from an output winding of the DC-DC converter for generating a high voltage power source to rectify and smooth the voltage of the tap, or by dividing the 300 V voltage of the high voltage power source by the use of a switching element such as a high breakdown voltage transistor to produce a temporary power source.

A power circuit of FIG. 14 corresponds to the former, which is provided with a 3–6 V power source 301 of a battery, a DC-DC converter 300 comprising a transistor 302 and a step-up transformer 303, a smoothing circuit for a high voltage power source $V_{CM}$ comprising a diode 304 and the main capacitor 2, and a smoothing circuit for the gate drive power source $V_{GG}$ comprising a diode 305 and a capacitor 306. In a flash device in which $V_{GG}$ is simultaneously generated while the DC-DC converter 300 is in operation and the operation of the DC-DC converter 300 is terminated when the high voltage power source $V_{CM}$ reaches the specified output voltage (as is a current method for reducing battery consumption), charging of the gate drive power source $V_{GG}$ stops according to the cessation of oscillation of the DC-DC converter 300, and the consumed current of the gate drive circuit 100 and the leakage current of the capacitor 306 decrease the output voltage of the capacitor 306. In applications in which particularly large current is used such as flash control, because shortage of the gate voltage of the IGBT is fatal and causes element breakage, the decrease in the output voltage must be controlled to be minimum. Therefore, it is necessary to sufficiently increase the capacitance of the capacitor 306 or to sufficiently decrease the consumed current of the gate drive circuit 100. For example, for holding the gate drive power source $V_{GG}$ at 33 V to 28 V for a minute when the consumed current of the gate drive circuit 100 is 10 $\mu$A, the required capacitance of the capacitor 306 is 120 $\mu$F. A capacitor having such capacitance and a breakdown voltage of about 50 V is considerably large and costly so that the economical burden on the flash controller for which low cost is required is too large.

A power circuit of FIG. 15 corresponds to the latter. In the power circuit, transistors 406 and 402 are turned on by an emission start signal from a camera, and thereby a capacitor 400 which has been charged through a resistor 401 by the high voltage power source $V_{CM}$ is discharged through the high voltage transistor 402 and a resistor 403 to a constant voltage diode 404. A capacitor 405 is charged with this voltage, which is used for the gate drive power source $V_{GG}$. In this power circuit, the transistor 101 and the logical circuit 103 of FIG. 12 can be omitted. This type of power circuit needs a high breakdown voltage transistor of more than 300 V and a large number of components, so that the economical burden on the flash controller for which low cost is strongly desired is also too large.

If an IGBT having the low gate drive voltage is developed and used as the IGBT 6 of FIG. 12, the lower limit value $V_{GE(OFF)}$ of the gate voltage $v_G$ (or a gate-emitter threshold voltage $V_{GE(th)}$) for holding the IGBT 6 in off-state falls down to about one-third compared with the case of using the normal IGBT. Therefore, the gate voltage $v_G$ must be lower than the threshold voltage for turning-off drive. However, in the circuit of FIG. 12, since the gate voltage $v_G$ shows exponential decrease, the off-drive of the gate is slowed as the gate voltage $v_G$ is decreased. When the off-drive of the gate is too slow, turning-off of the IGBT 6 is also slowed and the amount of flash light grows larger than desired and expected, creating a possibility of overexposure in photography, particularly in close-up picture taking.

SUMMARY OF THE INVENTION

According to the present invention, a gate drive circuit for on-and-off-driving an insulated gate semiconductor device comprises first and second power terminals, first and second reverse-blocking switches connected in series between the first and second power terminals, an inductance element connected between a junction point of the first and second reverse-blocking switches and a gate of the insulated gate semiconductor device, and a control circuit for on-and-off-driving the insulated gate semiconductor device by on-and-off-controlling the first and second reverse-blocking switches, wherein the inductance element has inductance sufficient to generate LC resonance in cooperation with a gate input capacitance of the insulated gate semiconductor device.

The present invention is also directed to a flash controller using a gate drive circuit of the above. According to the present invention, a flash controller comprises first and second high voltage power terminals, an insulated gate semiconductor device on-and-off-driven by a gate drive circuit, a flash discharge tube connected in series with the insulated gate semiconductor device between the first and second high voltage power terminals, a flash energy storing capacitor connected in parallel to a series connected body composed of the insulated gate semiconductor device and the flash discharge tube, and a trigger circuit for triggering the flash discharge tube to start flash discharge, the gate drive circuit comprising first and second power terminals, first and second reverse-blocking switches connected in series between the first and second power terminals, an inductance element connected between a junction point of the first and second reverse-blocking switches and a gate of the insulated gate semiconductor device, and a control circuit for on-and-off-driving the insulated gate semiconductor device by on-and-off-controlling the first and second reverse-blocking switches, wherein the inductance element has inductance sufficient to generate LC resonance in cooperation with a gate input capacitance of the insulated gate semiconductor device.

In the gate drive circuit for the insulated gate semiconductor device according to the present invention, the inductance element is used instead of a resistor as an element for restricting gate charge and discharge current. The LC resonance is induced by the inductance of the inductance element and the gate input capacitance of the insulated gate semiconductor device. The first and second switches for switching the gate drive current are provided with reverse-blocking characteristics. Therefore, while controlling the current peak values of the first and second switches at low levels, high-speed switching of the insulated gate semiconductor device can be achieved. As a result, the gate drive circuit capable of high-speed switching with less power losses can be obtained.

In the flash controller according to the present invention, the insulated gate semiconductor device inserted into a flash main circuit is on-and-off-driven by the use of the gate drive circuit having the aforesaid excellent characteristics. Therefore, the flash controller with small size and low cost can be obtained which is not required to use large-sized and high breakdown voltage parts.

Accordingly, an object of the present invention is to provide a gate drive circuit capable of switching an insulated gate semiconductor device at a high speed with less power losses.

Another object of the present invention is to provide a flash controller with small size and low cost.

These and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
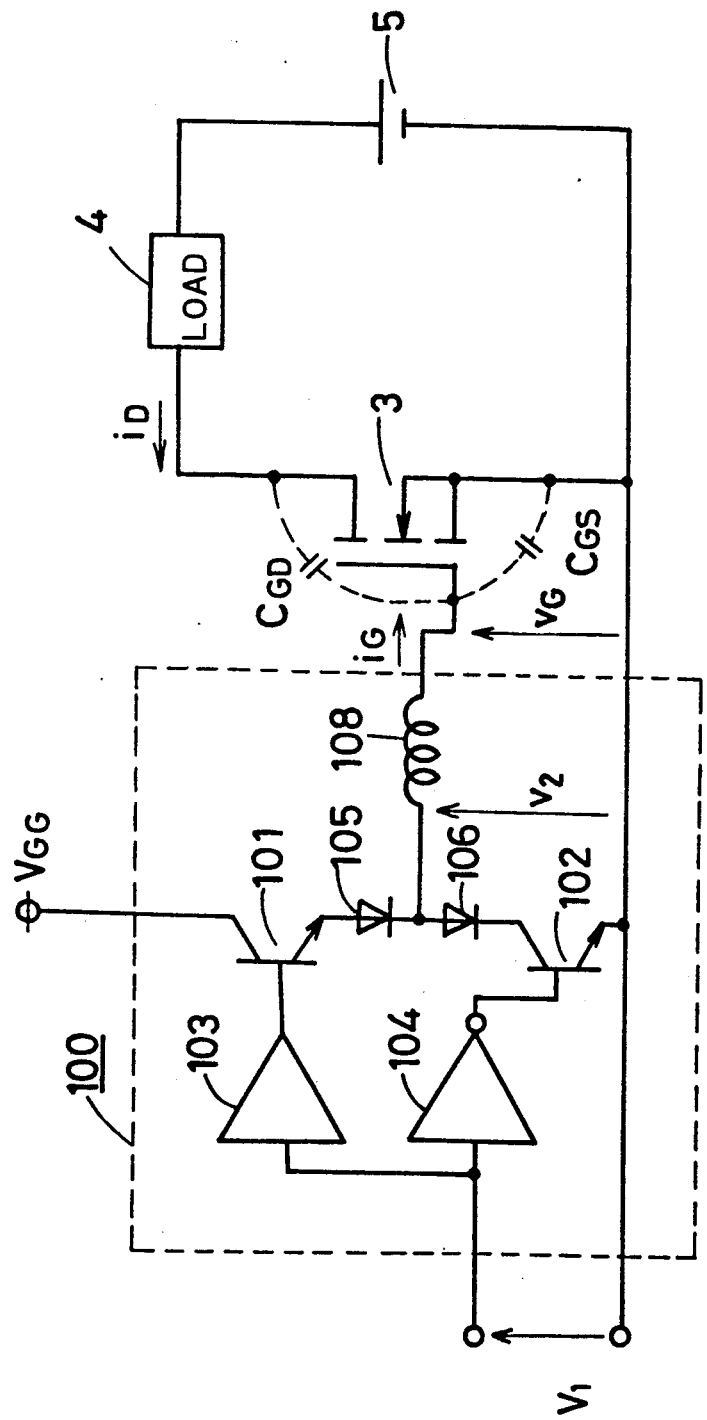
FIG. 1 is a circuit diagram showing one preferred embodiment of a gate drive circuit according to the present invention.
Figure 2:
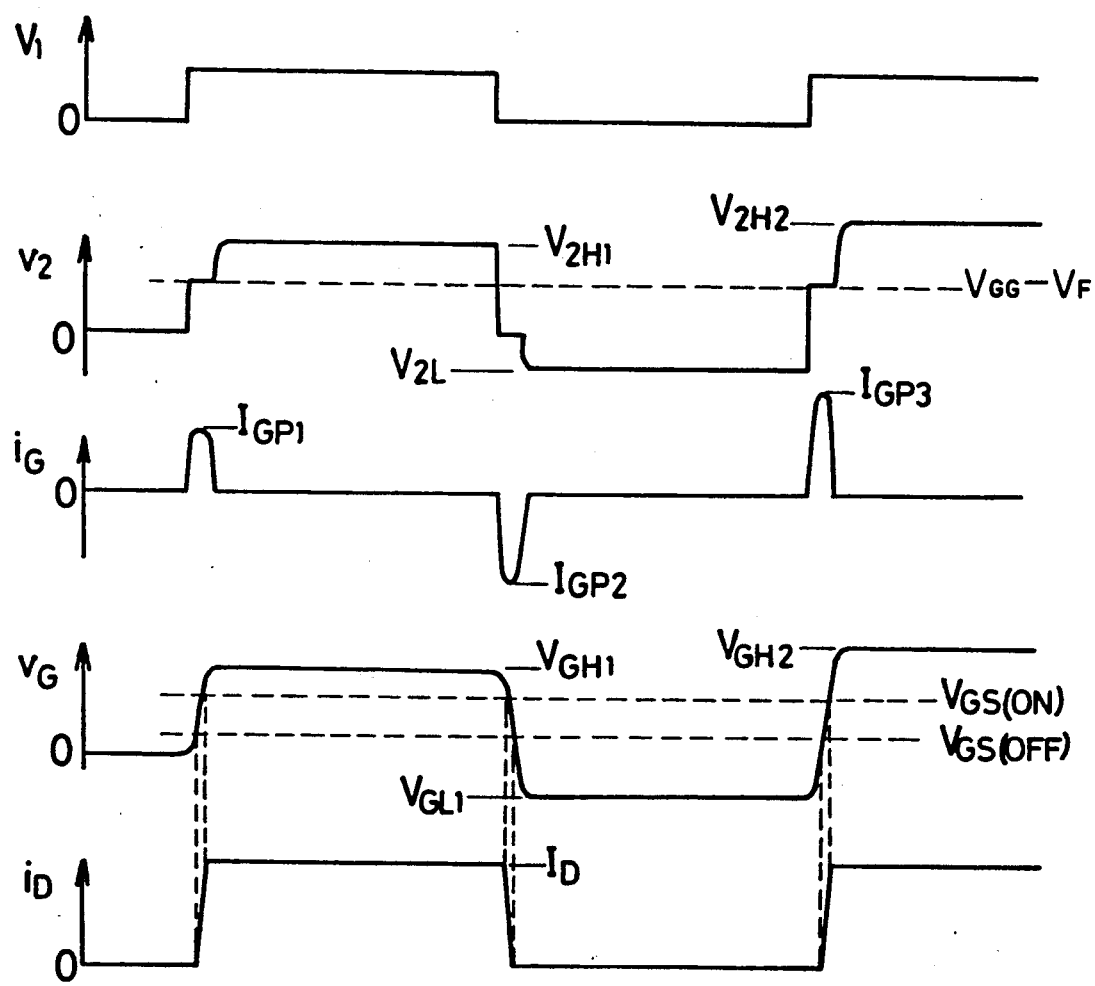
FIG. 2 is a waveform chart showing operating waveforms thereof.

FIG. 1 is a circuit diagram showing one preferred embodiment of a gate drive circuit for an insulated gate semiconductor device according to the present invention and FIG. 2 is a waveform chart showing operating waveforms of the circuit of FIG. 1. In a gate drive circuit 100 of FIG. 1, an inductance element 108 is used instead of the conventional gate resistor 110. Diodes 105 and 106 are connected in series to switching transistors 101 and 102, respectively. A first reverse-blocking switch is composed of the switching transistor 101 and the diode 105, and a second reverse-blocking switch is composed of the switching transistor 102 and the diode 106. The rest are similar in structure to the conventional gate drive circuit of FIG. 9.

Referring to the waveform chart of FIG. 2, an operation of the circuit of FIG. 1 is explained hereinafter. When a control input $V_1$ changes to a high level in the initial state in which a gate voltage $v_G$ of a power MOSFET 3 is zero, the switching transistor 101 is turned on and the switching transistor 102 is turned off. Accordingly, an input capacitance $C_{iss}$ of the MOSFET 3 is charged by a gate drive power source $V_{GG}$ through the switching transistor 101, the diode 105 and the inductance element 108. At this time, if an inductance L is in the following relation:

$$L \gg \tfrac{1}{4}C_{iss}R_S^2 \qquad (4)$$

with respect to an equivalent series resistance $R_S$ which is the sum of an internal series resistance of the gate drive circuit 100 and an equivalent input resistance of the power MOSFET 3, an oscillatory waveform is obtained. If L is increased sufficiently, a gate current $i_G$ shaped like a half-sine wave can be passed. For example, when $C_{iss}=10$ nF and $R_S=5\Omega$, sufficient is $L \gg > 83$ nH. By virtue of this resonance phenomenon, the gate voltage $v_G$ of the MOSFET 3 can be charged up to a value higher than the gate drive power source $V_{GG}$. In particular, the larger the value on the left-hand side in the expression (4) (or Q) is, the larger a charge value $V_{GH1}$ of the gate voltage $v_G$ in an initial cycle is, so that it approximates to $(V_{GG}-V_F)\times 2$, where $V_F$ is a forward voltage drop of the diode 105.

When the control input $V_1$ is switched to a low level in this state, the switching transistor 101 is turned off and the switching transistor 102 is turned on. Accordingly, the gate input capacitance $C_{iss}$ of the MOSFET 3 which has been charged is discharged through the inductance element 108, the diode 106 and the switching transistor 102. At this time, the gate current $i_G$ can be in the shape of a sine wave as mentioned above. Since the variation of a voltage $v_2$ is expressed by $(V_{2H1}-V_F)$ in this cycle, a voltage amplitude is larger than $(V_{GG}-V_F)$ of the initial resonance. As a result, the gate voltage $v_G$ of the power MOSFET 3 is charged to a negative voltage $(V_{GL1})$. Likewise, the absolute value of a gate current peak value $I_{GP2}$ in this cycle is larger than that of a gate current peak value $I_{GP1}$ in the initial cycle.

Furthermore, when the control input $V_1$ is switched to the high level, the switching transistors 101 and 102 are inverted respectively, and the gate voltage $v_G$ of the MOSFET 3 is charged to the positive polarity again by virtue of the resonance generated by the power source of $(V_{GG}-V_F-V_{2L})$ to reach $V_{GH2}$ which is higher than the charge voltage $V_{GH1}$ in the initial cycle.

Subsequently, by the repetition of such switchings, the gate voltage $v_G$ of the power MOSFET 3 grows larger for each cycle. However, if a suitable parallel resistor is provided between gate and source of the power MOSFET 3, the gate voltage $v_G$ can be controlled to a suitable voltage.

Figure 3:
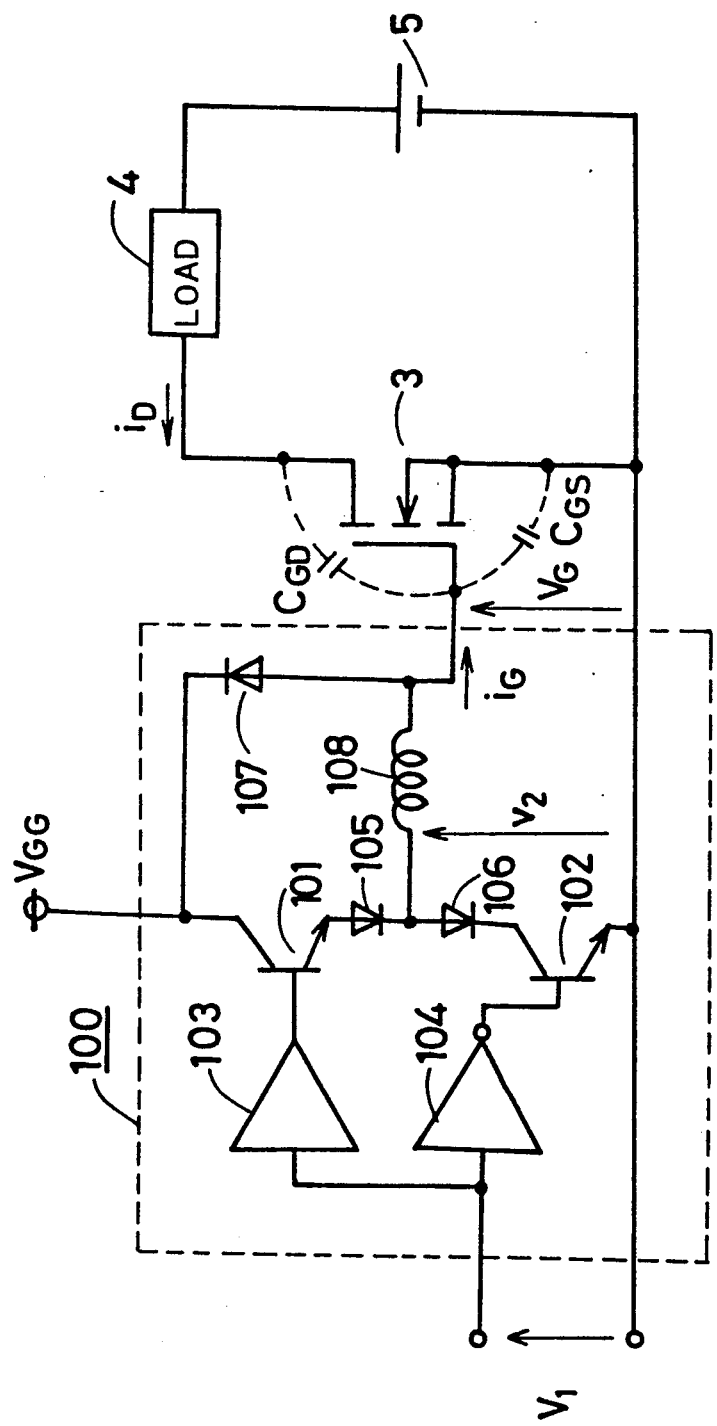
FIG. 3 is a circuit diagram showing another preferred embodiment of the gate drive circuit according to the present invention.
Figure 4:
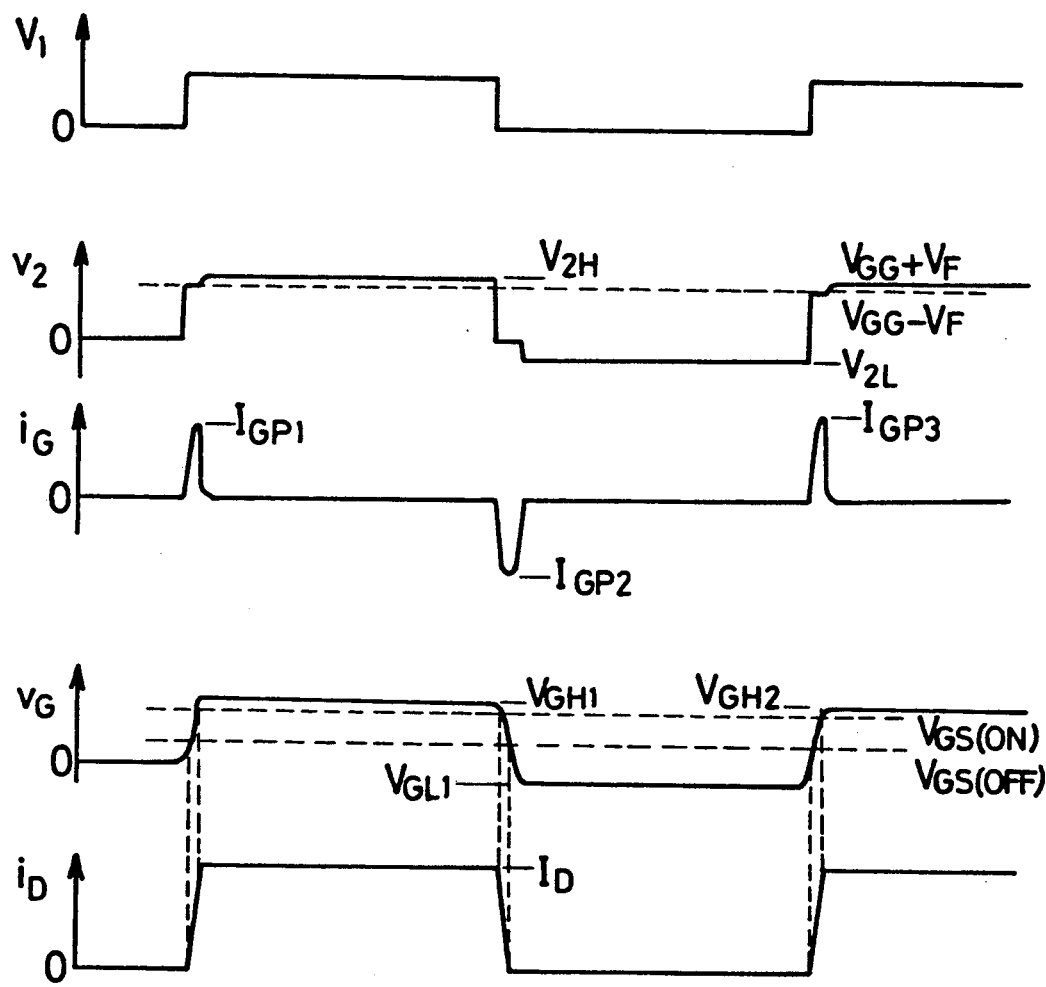
FIG. 4 is a waveform chart showing operating waveforms thereof.

As shown in FIG. 3, a diode 107 whose anode and cathode are connected to the gate of the power MOSFET 3 and the gate drive power source $V_{GG}$ respectively may be additionally provided to regenerate the gate voltage $v_G$ which is the output voltage of the gate drive circuit 100 to the gate drive power source $V_{GG}$. An example of operating waveforms in this case is shown in FIG. 4. Thus, overcharge of the gate voltage $v_G$ can be prevented, and an average supply current from the gate drive power source $V_{GG}$ can be reduced substantially by half compared with the case of FIG. 1.

The gate drive circuit according to the present invention is operated substantially as described above. A switching speed of the insulated gate semiconductor device to be driven is examined hereinafter. Similarly to the case of the conventional gate drive circuit of FIG. 9, rise time $t_r$ and fall time $t_f$ with respect to the switching of the power MOSFET 3 are defined as time periods required for rising and falling of the gate voltage $v_G$ between $V_{GS(OFF)}$ and $V_{GS(ON)}$ respectively. If standardization is made so that the peak value of the gate current $i_G$ in the case of charging the gate input capacitance $C_{iss}$ with the conventional exponential (non-resonance) waveform is equal to that in the case of charging the gate input capacitance $C_{iss}$ with the half-sine (resonance) waveform according to the present invention, the waveforms of the gate current $i_G$ are shown in FIG. 11(a). That is, if the peak values are equal, the pulse width of the half-sine wave current must be $\pi/2$ times larger than the time constant $\tau$ of the exponential current. The rising curves of the gate voltage $v_G$ charged with such currents are shown in FIG. 11(b), if standardization is made so that the peak value in the case of non-resonance driving (in the prior arts) is equal to that in the case of resonance driving (in the present invention). If $V_{G(OFF)}$ is 20% of the charge finish voltage and $V_{G(ON)}$ is 80% thereof, the rise time $t_r$ of the power MOSFET 3 is as follows:

in resonance driving . . . $t_{r1}=0.644\tau$
in non-resonance driving . . . $t_{r2}=1.386\tau$.

Accordingly, $t_{r1}/t_{r2}=0.465$, and it is found that the switching in the half-sine wave charging according to the present invention can be substantially twice faster than that in the exponential charging of the prior arts.

Figure 9:
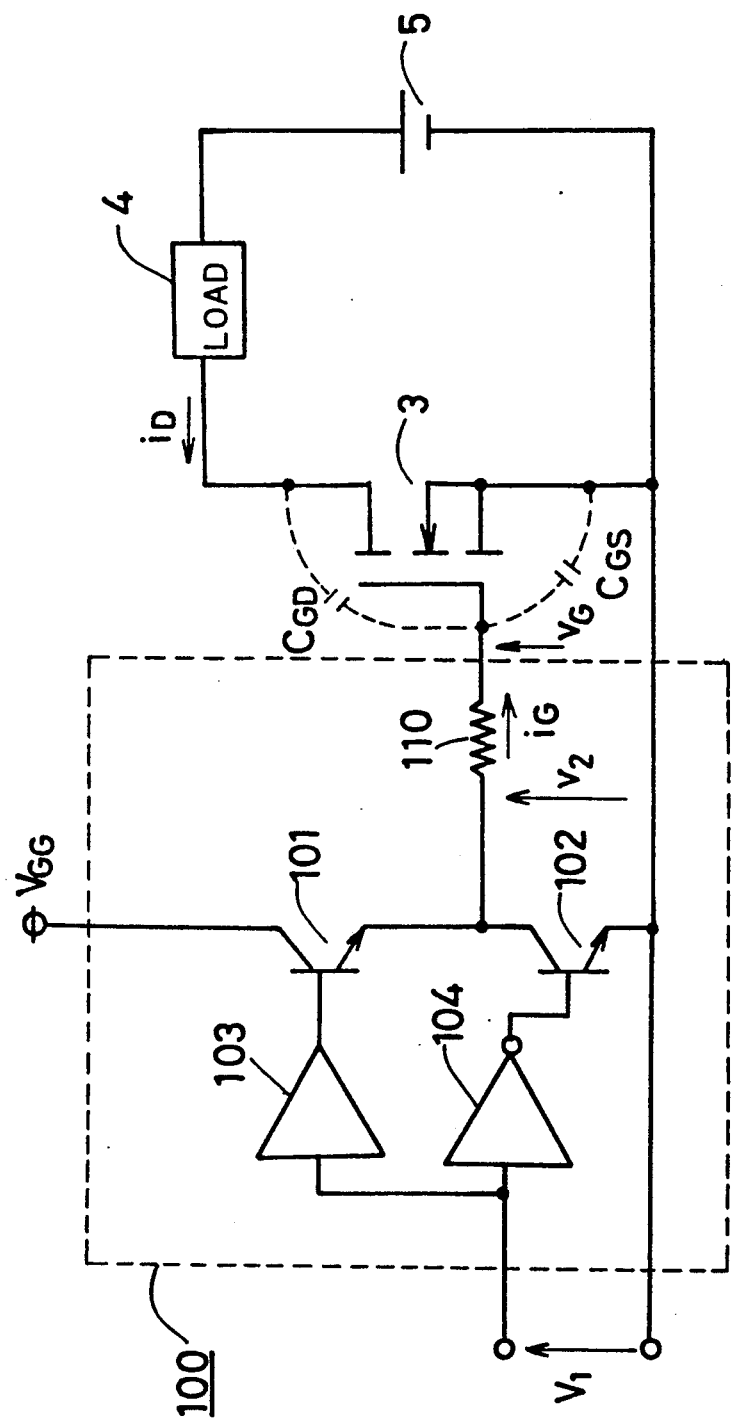
FIG. 9 is a circuit diagram showing a conventional gate drive circuit.
Figure 10:
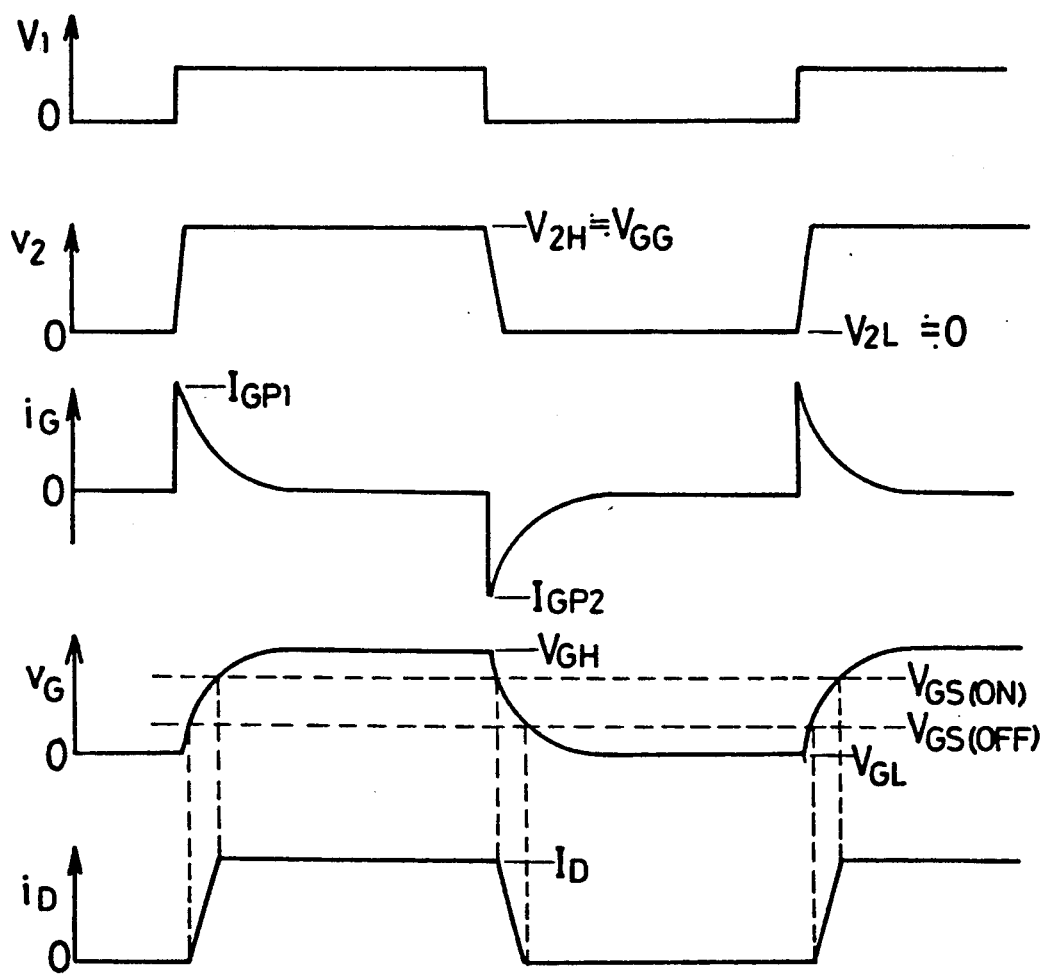
FIG. 10 is a waveform chart showing operating waveforms thereof.
Figure 11:
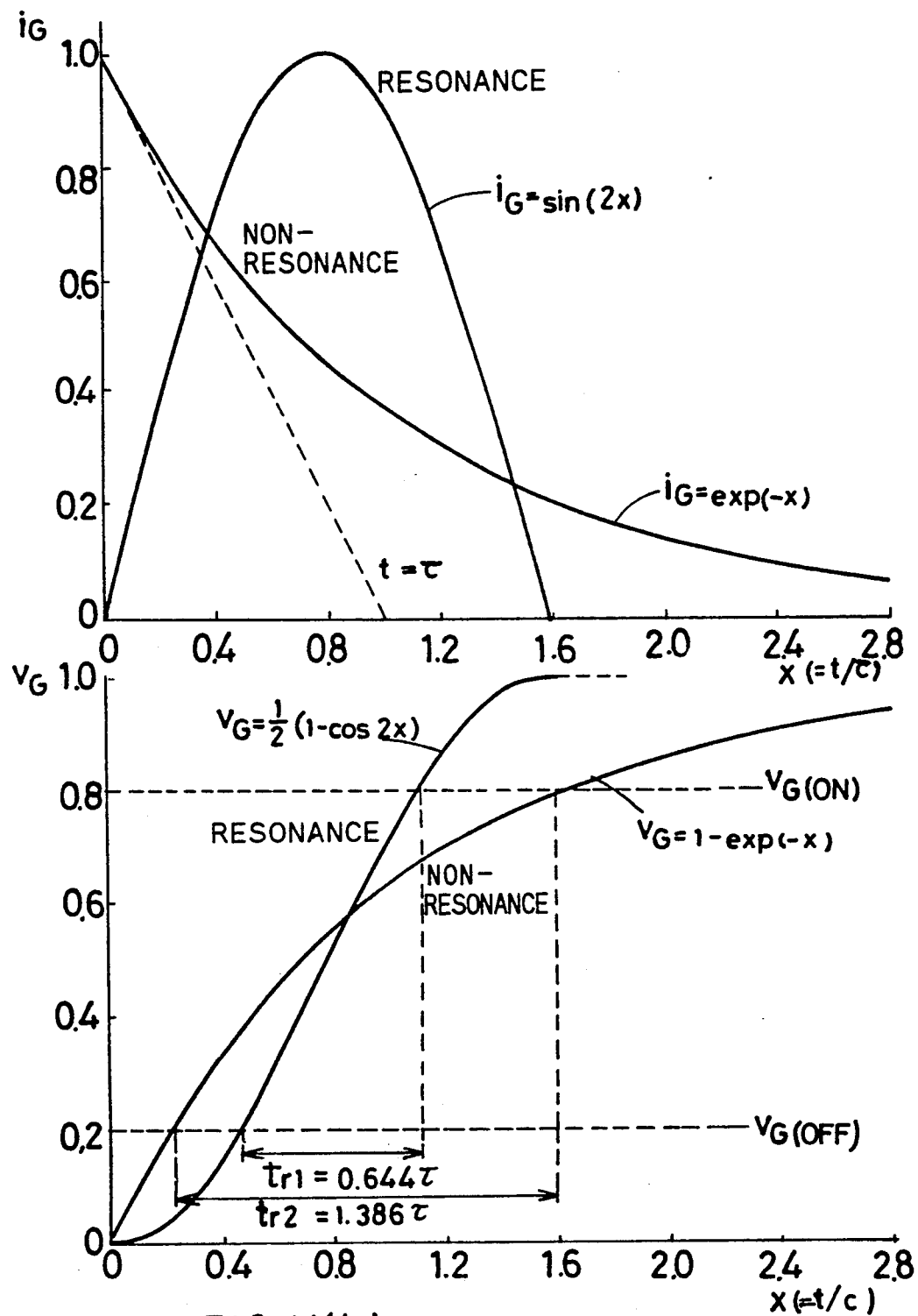
FIGS. 11(a) and 11(b) are waveform charts showing ideal resonance and non-resonance drive waveforms of a gate current and a gate voltage.

The waveforms of FIG. 11 are calculated with respect to the ideal sine-wave charging. More practically, FIG. 16 shows an example of waveforms calculated for the case where the equivalent series resistance $R_S$ is present which is the sum of the internal series resistance of the gate drive circuit 100 and the equivalent input resistance of the power MOSFET 3. FIG. 16 shows the waveforms at the switchings of turning-on and -off since the second cycle in the case where simulation is carried out by the use of a resonance drive circuit with the regenerative diode 107 of FIG. 3 with the constants $V_{GG}=10$ V, $L=0.5$ $\mu$H, $C_{iss}=10$ nF and $R_S=5\Omega$. The waveforms of the resonance driving are plotted by black dots. According to the results, the peak value of the gate current $i_G$ by the resonance driving is 1.03 A. As the corresponding prior art, the results of the same simulation with the constants $V_{GG}=10$ V, $C_{iss}=10$ nF and $R_S=10\Omega$ in the non-resonance driving circuit of FIG. 9 are also shown in FIG. 16 for comparison. The waveforms of the non-resonance driving are plotted by white dots. The transfer characteristics of the MOSFET, $V_{GS(OFF)}=2$ V and $V_{GS(ON)}=8$ V, are applied to the results, the rise time $t_r$ and the fall time $t_f$ are as follows:

in resonance driving ... $t_r = 65$ ns
$t_f = 70$ ns
in non-resonance driving ... $t_r = 140$ ns
$t_f = 140$ ns.

It is found that the switching of the resonance driving according to the present invention is twice faster than that of the conventional non-resonance driving under the same gate current conditions even if the equivalent series resistance $R_S$ is considered more practically.

Normally, the inductance required for the inductance element 108 is as small as hundreds of nanohenries, so that an air-core coil and a ferrite bead are adaptable thereto, and a packaging area thereof is small.

In the gate drive circuit for the insulated gate semiconductor device according to the present invention as described above, the inductance element is used as a current restriction element and the reverse-blocking type driving switches are used, thereby the resonance being generated by the gate capacitance of the insulated gate semiconductor device and the inductance of the inductance element at the time of on-and-off-switching. Therefore, following practical effects can be obtained:

(1) In the case of using the driving switches having the same current rating, the switching speed of the insulated gate semiconductor device can be substantially twice faster than that of the prior art.

(2) The present invention is most suitable for turning off the insulated gate semiconductor device with particularly low $V_{GS(OFF)}$ at a high speed because gate reverse bias is generated automatically.

(3) Since the current is not restricted by the resistor but by the inductance element, the electric power consumption in this part is reduced.

(4) Since the rising rate of the current flowing to the driving switches is restrained by the inductance of the inductance element, the switching losses caused by the turning-on rise speed of the driving switches can be reduced. Combined with the above effect (1), high-frequency adaptation by the integrated circuit is facilitated.

The present invention has been described hereinabove on the basis of the preferred embodiments of FIGS. 1 and 3. However, various modifications as described below are applicable.

Figure 17:
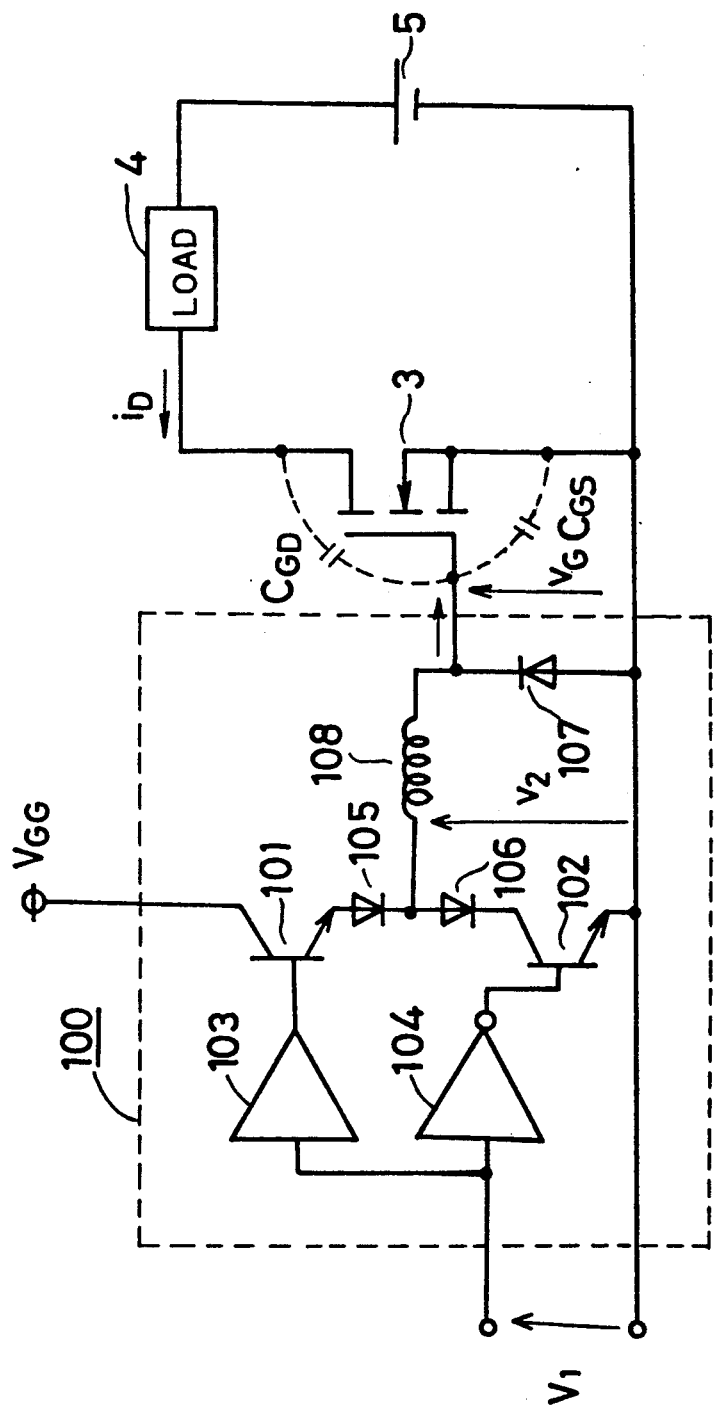
FIG. 17 is a circuit diagram showing still another preferred embodiment of the gate drive circuit according to the present invention.

(1) The overcharge of the gate voltage can be prevented even if the regenerative diode 107 of FIG. 3 is connected in parallel between gate and source of the power MOSFET 3 as shown in FIG. 17. However, the gate reverse bias effect cannot be obtained sufficiently in this case.

(2) About 2-3 V reverse-blocking breakdown voltage of the respective reverse-blocking switches composed of the combination of the switching transistor 101 and the diode 105 and the combination of the switching transistor 102 and the diode 106 is sometimes sufficient in the case where Q of the resonance circuit is low or the regenerative diode 107 is used. When bipolar transistors are used as switching transistors inside the reverse-blocking switches as shown in FIGS. 1 and 3 in this case, the reverse-blocking diodes 105 and 106 sometimes need not be particularly provided if the required reverse-blocking breakdown voltage is sufficiently lower than the breakdown voltage of the base-emitter junction of the bipolar transistors.

Figure 5:
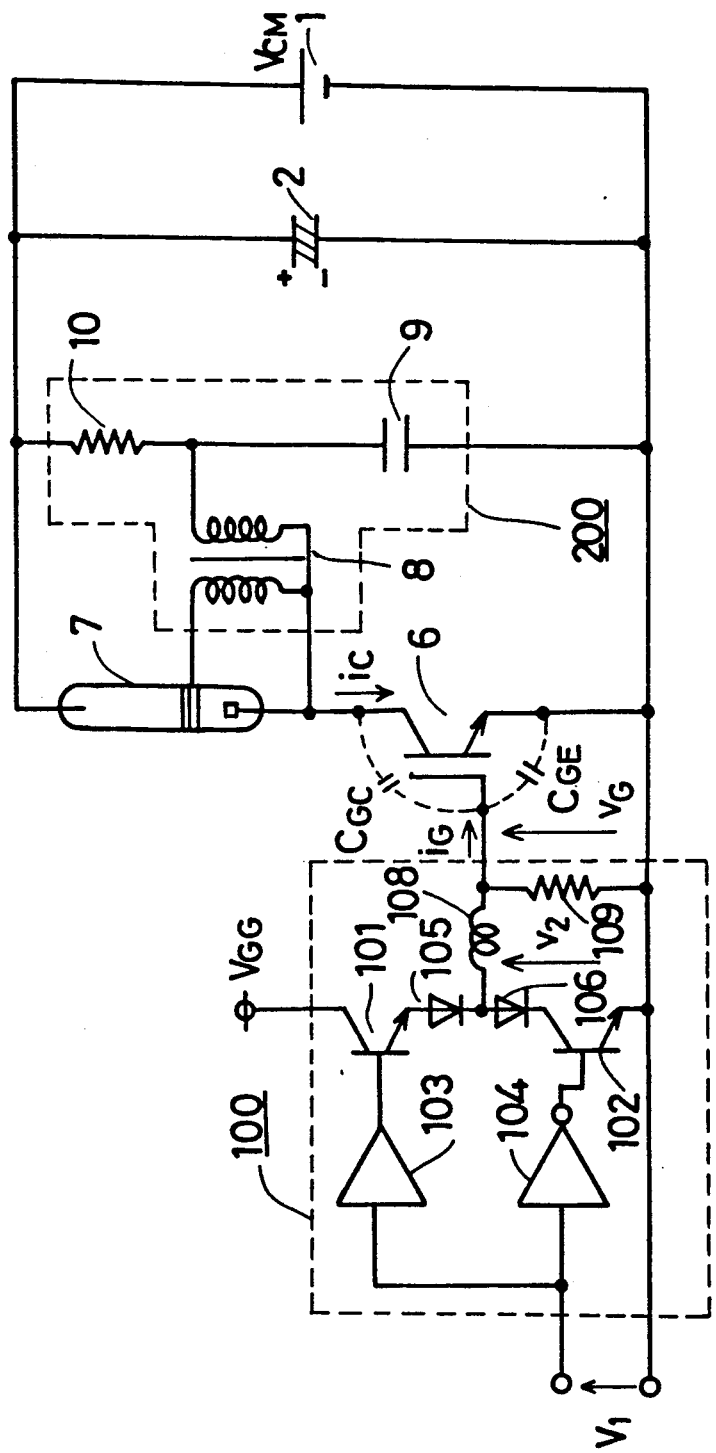
FIG. 5 is a circuit diagram showing one preferred embodiment of a flash controller according to the present invention.
Figure 6:
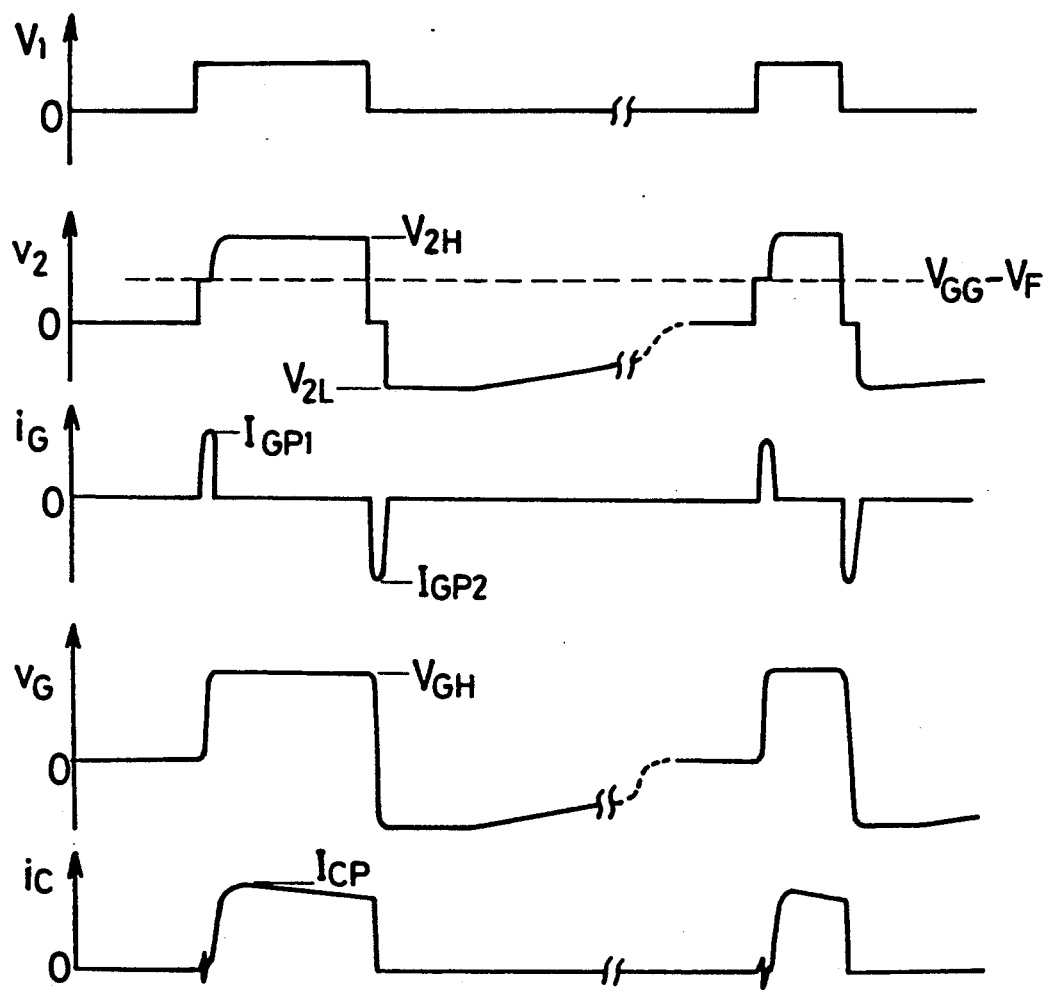
FIG. 6 is a waveform chart showing operating waveforms thereof.

FIG. 5 is a circuit diagram showing one preferred embodiment of a flash controller according to the present invention, and FIG. 6 is a waveform chart showing operating waveforms thereof. In the flash controller of FIG. 5, a gate drive circuit 100 for on-and-off-driving an IGBT 6 which is one type of the insulated gate semiconductor devices has the same construction as the gate drive circuit 100 shown in FIG. 1 except that a gate voltage discharging resistor 109 is connected between gate and emitter of the IGBT 6. The rest are similar in structure to the conventional flash controller of FIG. 12.

Referring to the waveform chart of FIG. 6, an operation of the flash controller of FIG. 5 is explained hereinafter. If the inductance L of the inductance element 108 is in the following relation:

$$L >> \tfrac{1}{4} C_{iss} R_S^2 \qquad (5)$$

with respect to the equivalent series resistance $R_S$ which is the sum of the internal series resistance of the gate drive circuit 100 and the equivalent input resistance of the IGBT 6 and the gate input capacitance $C_{iss}$ of the IGBT 6, the gate current $i_G$ of the IGBT 6 is oscillatory when the switching transistors 101 or 102 is switched on/off. The gate current $i_G$ shows the half-sine waveform according to the reverse-blocking characteristics of the respective switches composed of the combination of the transistor 101 and the diode 105 and the combination of the transistor 102 and the diode 106. Accordingly, for example, when the inductance L is sufficiently large, the gate voltage $v_G$ in on-driving of the IGBT 6 can be stepped up to about twice as large as the gate drive power source $V_{GG}$ by the LC resonance as described above ($V_{2H} \approx 2 \cdot V_{GG}$). As a result, the voltage value required for the gate drive power source $V_{GG}$ is only about a half of $V_{GE(ON)}$ required for the on-driving of the IGBT 6.

As aforementioned, an IGBT capable of controlling the peak current of about 130A with the gate voltage of about 10 V has been developed. If it is used as the IGBT 6, flash control is possible by using a 6 V battery directly as the gate drive power source $V_{GG}$ in the circuit of FIG. 5.

As described above, the LC resonance is operated also in off-driving of the IGBT 6 and the gate of the IGBT 6 is negatively biased ($V_{2L} \approx -V_{2H}$). Thereby, even the IGBT with low $V_{GE(th)}$ in which the gate drive voltage is lowered can be turned off at a high speed because the gate voltage $v_G$ varies rapidly in the vicinity of the threshold value thereof.

In the circuit of FIG. 5, the gate input capacitance $C_{iss}$ of the IGBT 6 which has been charged to negative is discharged by the discharging resistor 109. If the next on-driving is carried out when the discharge is finished, the above operation can be repeated. However, if the next on-driving is carried out before the negative discharge is finished, the positive gate drive voltage sometimes increases up to a maximum of $4 \cdot V_{GG}$, so that care must be taken to hold the positive gate drive voltage below the gate breakdown voltage rating of the IGBT 6. If a large gate reverse bias is not particularly required to be applied, stable repetition operations can be achieved by connecting the diode in parallel between gate and emitter of the IGBT 6 (or connecting the cathode to the gate and the anode to the emitter).

Figure 7:
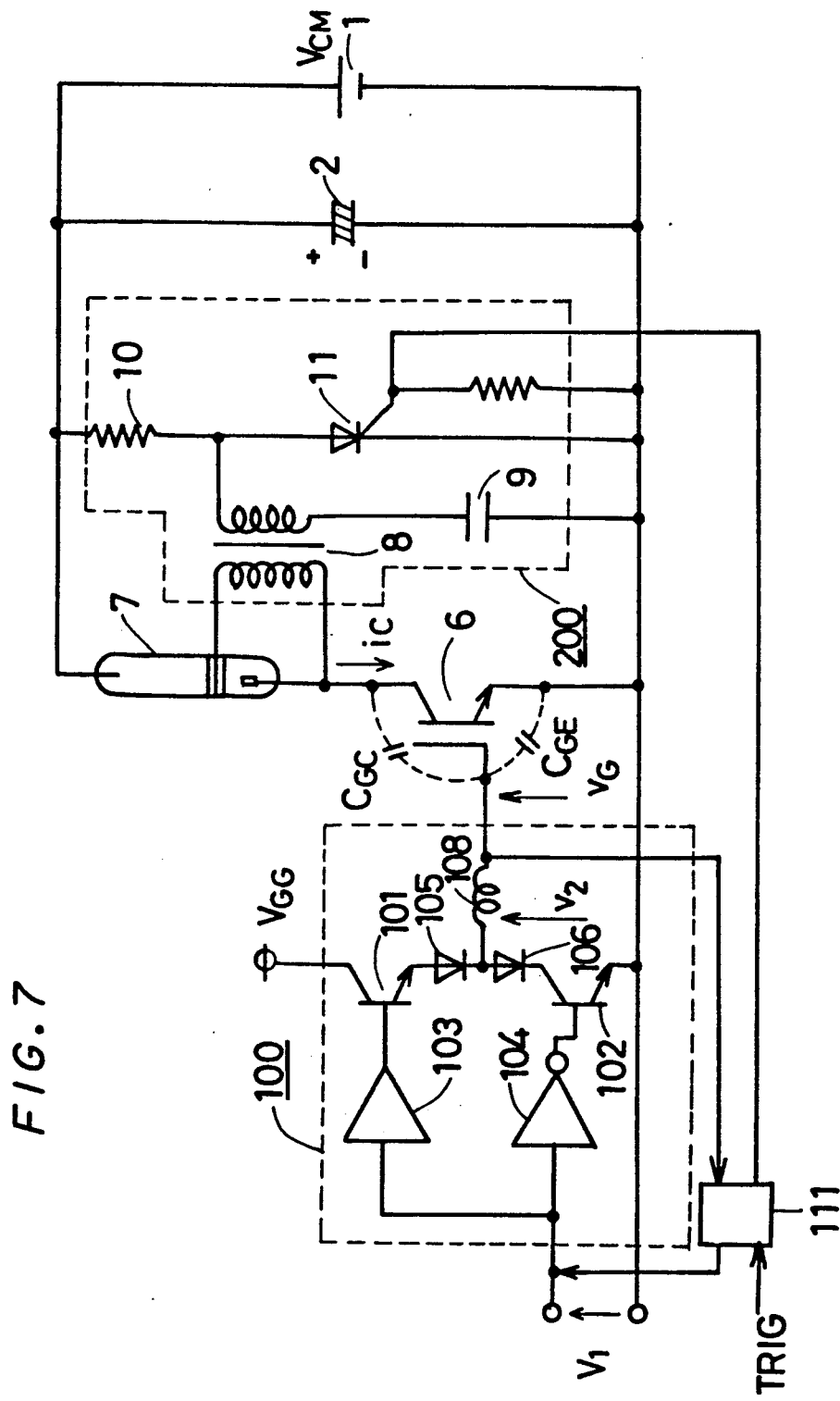
FIG. 7 is a circuit diagram showing another preferred embodiment of the flash controller according to the present invention.
Figure 8:
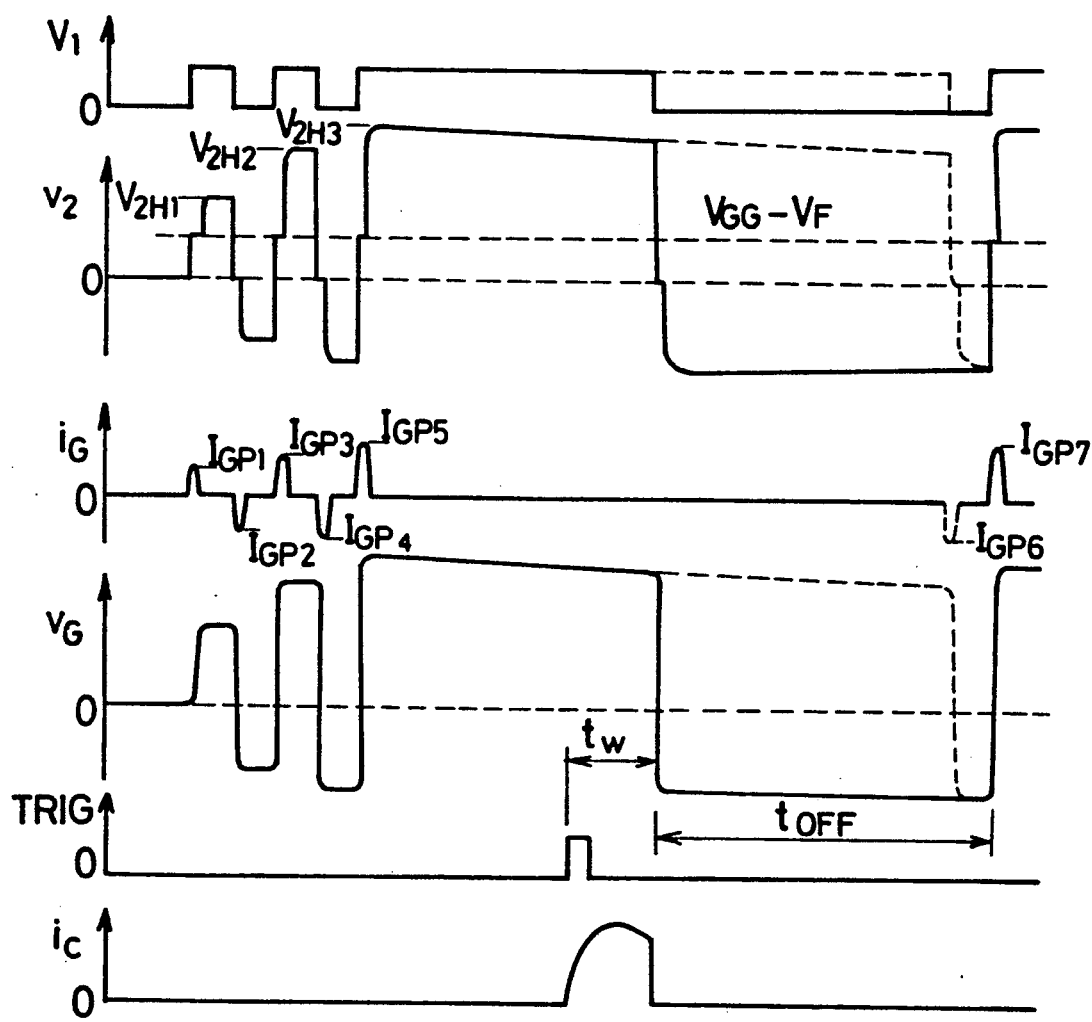
FIG. 8 is a waveform chart showing operating waveforms thereof.

FIG. 7 is a circuit diagram showing another preferred embodiment of the flash controller according to the present invention, and FIG. 8 is a waveform chart showing operating waveforms thereof. In the flash controller of FIG. 7, the gate drive circuit 100 for on-and off-driving the IGBT 3 is the same as that of FIG. 5. However, the difference from FIG. 5 in structure is that a thyristor switch 11 is used separately as means for providing a trigger circuit 200 of a flash discharge tube 4 with trigger energy and an emission start signal from a camera and the like is supplied to the thyristor switch 11. The emission stop signal is supplied by applying a negative level to the control input $V_1$ of the gate drive circuit 100.

Referring to the waveform chart of FIG. 8, an operation of the circuit of FIG. 7 is explained hereinafter. In a stand-by condition when the emission start signal TRIG is possibly outputted from the camera, the gate voltage $v_G$ is held high so that the IGBT 6 can pass a predetermined flash charge tube current at all times. When the control input $V_1$ of the gate drive circuit 100 is switched between the low and high levels, the high level voltage of the gate of the IGBT 6 increases by the LC resonance at switching as the number of switchings increases, as described above. If the control input $V_1$ is held high when the gate voltage is less than the gate breakdown voltage rating of the IGBT 6 and reaches a sufficient value, the gate voltage $v_G$ of the IGBT 6 is held at a value larger than the gate voltage $V_{GE(ON)}$ required for the conduction of the IGBT 6 for a while by the gate input capacitance $C_{iss}$ thereof. This voltage can be monitored by a voltage control circuit 111 to be controlled within a required gate voltage range. The voltage control circuit 111 can be easily composed, for example, of a voltage comparator and an oscillation circuit.

If the emission start signal TRIG from the camera is received while the gate voltage $v_G$ is within the predetermined voltage range, the gate of the thyristor switch 11 for trigger is triggered by way of the voltage control circuit 111, and thereby flash discharge by the flash discharge tube 7 can start. In order to terminate the flash discharge by the flash discharge tube 7 after a conducting time $t_W$ has passed and a desired amount of light is obtained, the control input $V_1$ should be only switched to the low level. For several ms after the flash discharge is terminated, gas in the flash discharge tube 7 has been ionized, so that mislighting is liable to occur. Therefore, the gate voltage $v_G$ of the IGBT 6 is required to be provided with an off-period $t_{OFF}$ having a suitable length.

If the emission start signal TRIG is transmitted while the gate voltage $v_G$ of the IGBT 6 is low due to its pumping operation, the trigger pulse should be applied to the thyristor switch for trigger 11 after the pumping operation is finished. This time-lag can be easily controlled below tens of microseconds, so that there is no interference with photographing.

The circuitry of FIG. 7 has the advantage that the battery voltage supplying the gate drive power source $V_{GG}$ can be selected arbitrarily because the gate voltage $v_G$ can be amplified in some measure arbitrarily for the gate drive power source $V_{GG}$.

Figure 12:
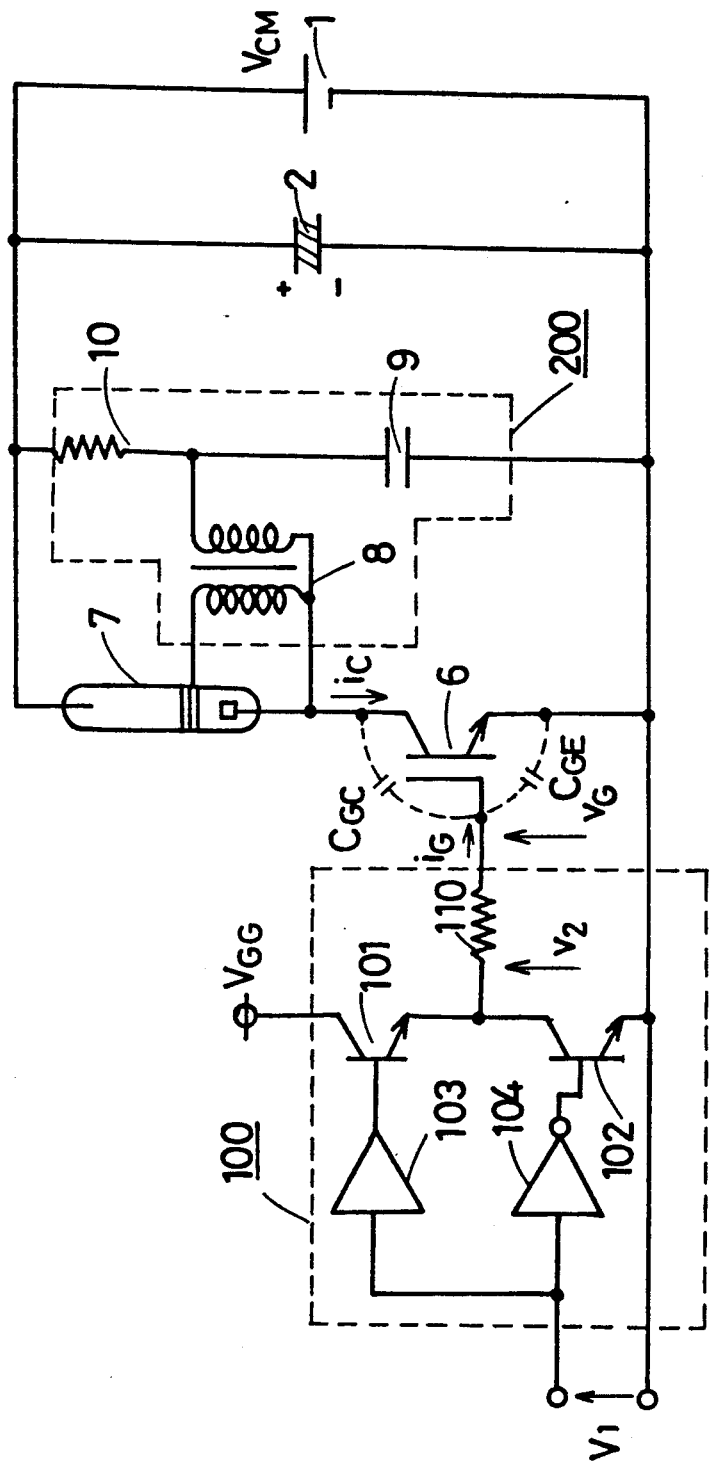
FIG. 12 is a circuit diagram showing a conventional flash controller.
Figure 13:
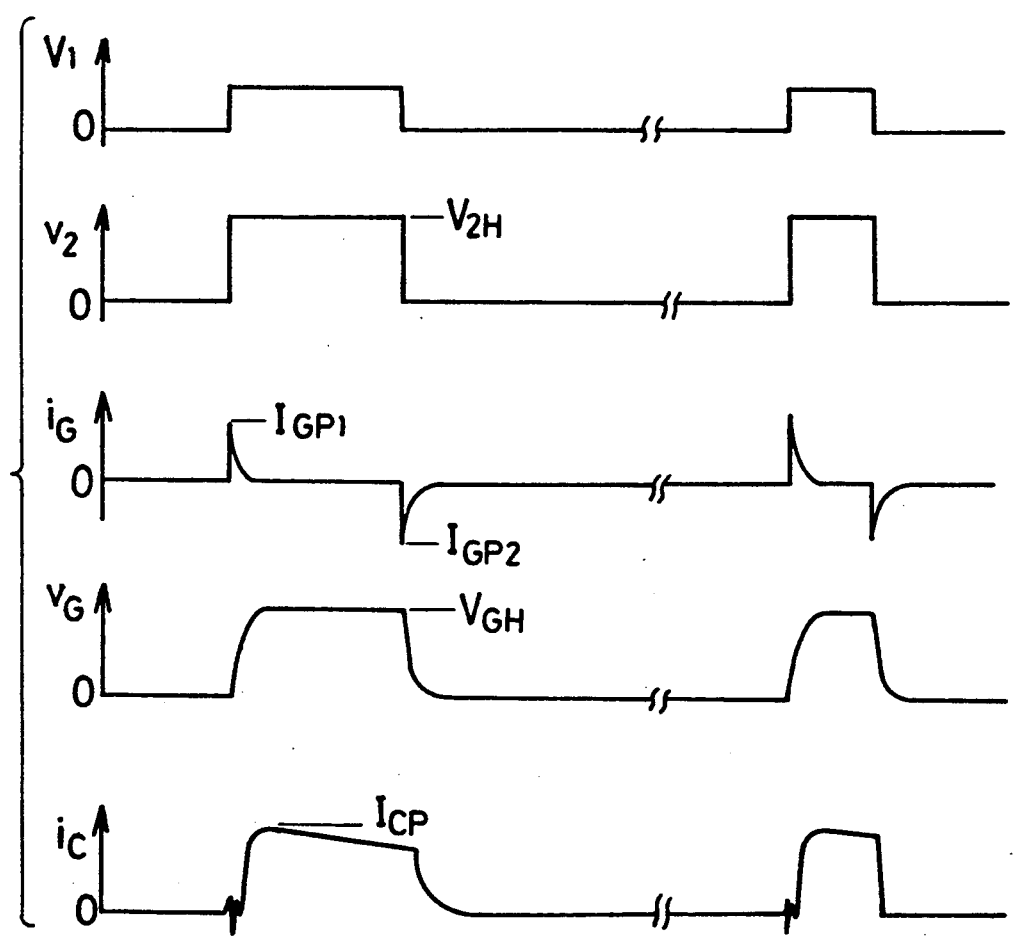
FIG. 13 is a waveform chart showing operating waveforms thereof.
Figure 14:
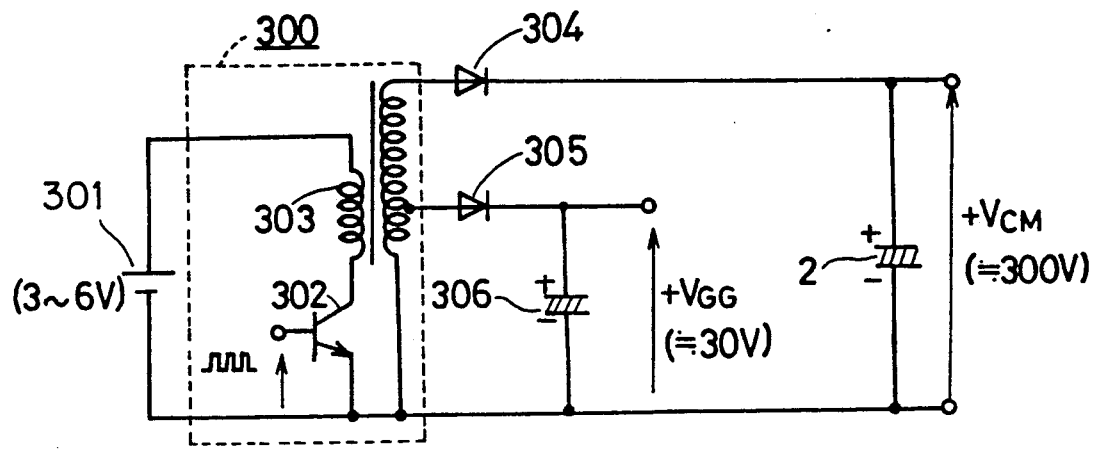
FIGS. 14 and 15 are circuit diagrams showing gate drive power sources in the conventional flash controller.
Figure 15:
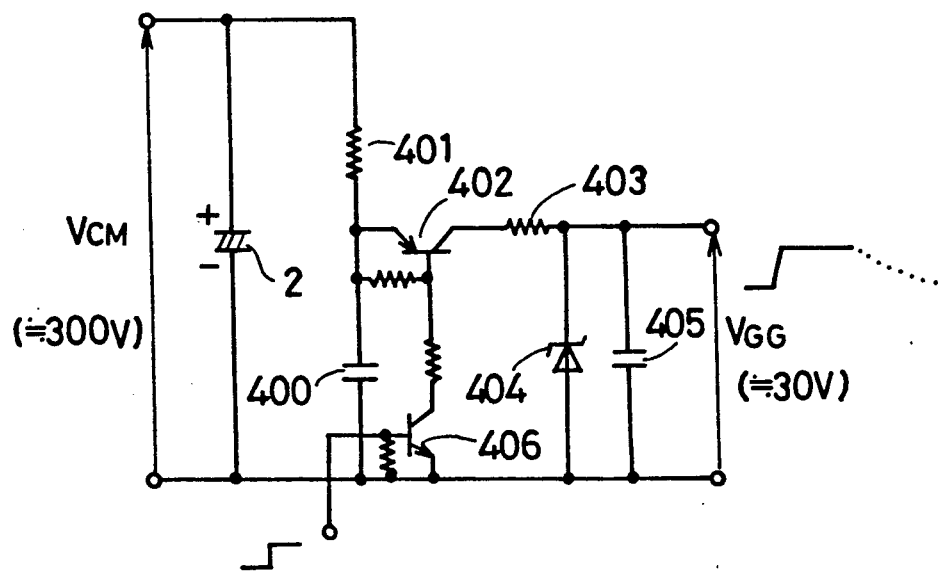
Figure 16A:
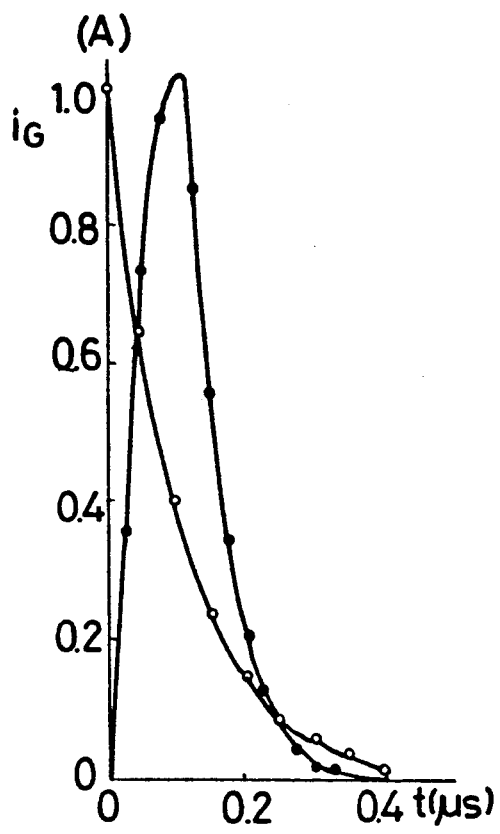
FIGS. 16(a)–16(d) are waveform charts showing resonance and non-resonance drive waveforms of the gate current and the gate voltage in turning on and off in consideration of an actual equivalent series resistance.
Figure 16B:
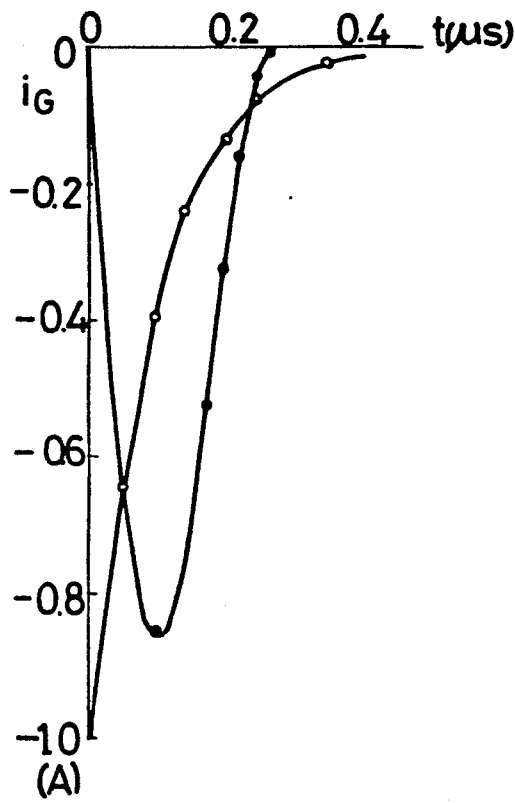
Figure 16C:
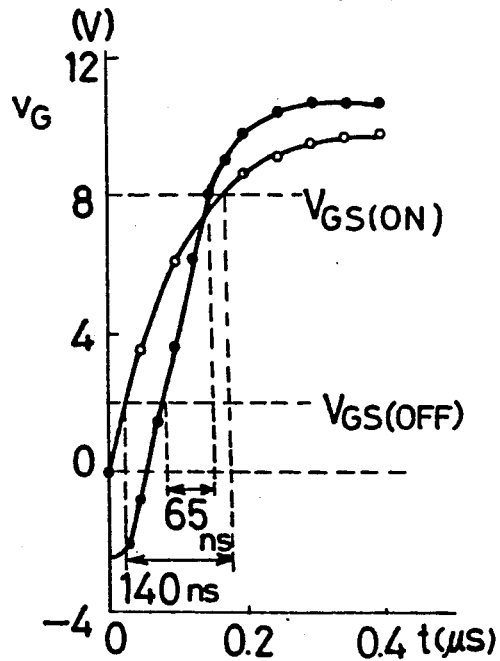
Figure 16D:
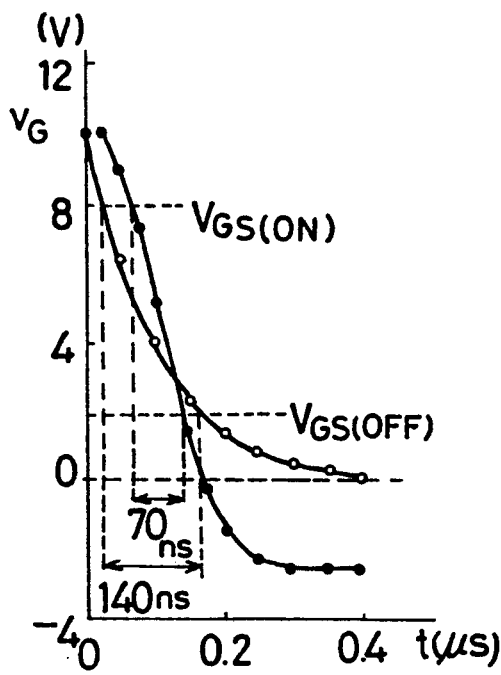

As for the speed of the gate drive switching, comparison is made between the conventional flash controller of FIG. 12 and the resonance gate drive type flash controller according to the present invention shown in FIGS. 5 and 7. As above-mentioned with respect to FIG. 11, if the time periods $t_r$ and $t_f$ when the gate voltage $v_G$ of the IGBT 6 varies between 20% and 80% of the whole amplitude are viewed, it is found that the resonance gate drive type flash controller according to the present invention can be driven about twice faster than the conventional flash controller. Conversely, at the same switching speed, the inductance of the inductance element 108 for restricting the current can be increased and the peak value of the switch current can be reduced by half. Accordingly, the current rating of the driving switches composed of the switching transistors 101 and 102 and the diodes 105 and 106 can be reduced, thereby economy being improved.

In the above preferred embodiments explained is the case of on-and-off-driving the IGBT for a stroboscope by the use of the resonance drive type gate drive circuit according to the present invention. However, the same effect can be obtained in the case of on-and-off-driving the power MOSFET and the like having the same insulated gate structure as the IGBT. For the applications in which increase of the gate voltage $v_G$ above the gate drive power source voltage $V_{GG}$ is meaningless, the gate voltage $v_G$ can be regenerated to the gate drive power source $V_{GG}$ by the diode 107, as shown in FIG. 3. Thus, particularly in the applications to high-frequency DC-DC converters and the like, the consumed current of the gate drive circuit 100 can be prevented from increasing.

The flash controller according to the present invention, in which the insulated gate semiconductor device inserted into the flash main circuit is resonance-driven by the use of the inductance element, has various practical effects described below.

(1) Since the gate drive voltage can be stepped up, batteries can be used as the gate drive power source $V_{GG}$. The miniaturization and cost reduction of the circuit can be achieved.

(2) Since the gate reverse bias voltage is applied at off-driving, high-speed turning off is achieved even in the insulated gate semiconductor device with a low threshold value.

(3) The switch current rating can be reduced, thereby cost of the gate drive circuit being reduced.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:

1. A gate drive circuit for on-and-off-driving an insulated gate semiconductor device, comprising:
   first and second power terminals for providing a relatively high first voltage and a relatively low second voltage, respectively;
   first and second reverse-blocking switches connected in series between said first and second power terminals;

an inductance element connected between a junction point of said first and second reverse-blocking switches and a gate of said insulated gate semiconductor device; and a control circuit for on-and-off-driving said insulated gate semiconductor device by on-and-off-controlling said first and second reverse-blocking switches, wherein said inductance element has inductance sufficient to generate LC resonance in cooperation with a gate input capacitance of said insulated gate semiconductor device, so that a gate voltage of said insulated gate semiconductor device is charged to a value higher than said first voltage.

2. A gate drive circuit in accordance with claim 1, wherein said first reverse-blocking switch includes a first transistor having a first electrode connected with said first power terminal, a second electrode coupled with said junction point and a control electrode connected with said control circuit, and said second reverse-blocking switch includes a second transistor having a first electrode coupled with said junction point, a second electrode connected with said second power terminal and a control electrode connected with said control circuit.

3. A gate drive circuit in accordance with claim 2, wherein said first reverse-blocking switch further includes a first diode having a first electrode connected with said second electrode of said first transistor and a second electrode connected with said junction point, and said second reverse-blocking switch further includes a second diode having a first electrode connected with said junction point and a second electrode connected with said first electrode of said second transistor.

4. A gate drive circuit in accordance with claim 3, wherein said first electrodes of said first and second transistors are collectors, said second electrodes of said first and second transistors are emitters, said first electrodes of said first and second diodes are anodes, and said second electrodes of said first and second diodes are cathodes.

5. A gate drive circuit in accordance with claim 2, wherein said control circuit comprises a first logical circuit connected with said control electrode of said first transistor and a second logical circuit connected with said control electrode of said second transistor, for turning on and off said first and second transistors complementarily.

6. A gate drive circuit in accordance with claim 1, further comprising a regenerative diode having an anode connected with said gate of said insulated gate semiconductor device and a cathode connected with said first power terminal, wherein said first power terminal supplies high power source voltage.

7. A gate drive circuit in accordance with claim 1, further comprising a regenerative diode having an cathode connected with said gate of said insulated gate semiconductor device and an anode connected with said second power terminal, wherein said second power terminal supplies low power source voltage.

8. A flash controller, comprising:
first and second high voltage power terminals;
an insulated gate semiconductor device on-and-off-driven by a gate drive circuit;
a flash discharge tube connected in series with said insulated gate semiconductor device between said first and second high voltage power terminals;
a flash energy storing capacitor connected in parallel to a series connected body composed of said insulated gate semiconductor device and said flash discharge tube; and
a trigger circuit for triggering said flash discharge tube to start flash discharge, said gate drive circuit comprising
first and second power terminals, for providing a relatively high first voltage and a relatively low second voltage, respectively;
first and second reverse-blocking switches connected in series between said first and second power terminals;
an inductance element connected between a junction point of said first and second reverse-blocking switches and a gate of said insulated gate semiconductor device; and
a control circuit for on-and-off-driving said insulated gate semiconductor device by on-and-off-controlling said first and second reverse-blocking switches,
wherein said inductance element has inductance sufficient to generate LC resonance in cooperation with a gate input capacitance of said insulated gate semiconductor device, so that a gate voltage of said insulated gate semiconductor device is charged up to a value higher than said first voltage.

9. A flash controller in accordance with claim 8, wherein said trigger circuit comprises
a trigger capacitor coupled between said first and second high voltage power terminals,
a switching means which is turned on in response to an emission start signal externally provided, and
a trigger transformer having a primary coil connected in loop with said trigger capacitor and said switching means and a secondary coil connected with said flash discharge tube said flash controller further comprising means for maintaining a gate voltage of said insulating gate semiconductor device at such a level that said insulated gate semiconductor device can be turned on, prior to provision of said emission start signal.

10. A flash controller in accordance with claim 9, wherein said switching means includes a thyristor switch.

11. A flash controller in accordance with claim 8, wherein said first reverse-blocking switch includes a first transistor having a first electrode connected with said first power terminal, a second electrode coupled with said junction point and a control electrode connected with said control circuit, and said second reverse-blocking switch includes a second transistor having a first electrode coupled with said junction point, a second electrode connected with said second power terminal and a control electrode connected with said control circuit.

12. A flash controller in accordance with claim 11, wherein said first reverse-blocking switch further includes a first diode having a first electrode connected with said second electrode of said first transistor and a second electrode connected with said junction point, and said second reverse-blocking switch further includes a second diode having a first electrode connected with said junction point and a second electrode connected with said first electrode of said second transistor.

13. A flash controller in accordance with claim 12, wherein said first electrodes of said first and second transistors are collectors, said second electrodes of said first and second transistors are emitters, said first electrodes of said first and second diodes are anodes, and said second electrodes of said first and second diodes are cathodes.

14. A flash controller in accordance with claim 11, wherein said control circuit comprises a first logical circuit connected with said control electrode of said first transistor and a second logical circuit connected with said control electrode of said second transistor, for turning on and off said first and second transistors complementarily.

15. A flash controller in accordance with claim 8, further comprising a regenerative diode having an anode connected with said gate of said insulated gate semiconductor device and a cathode connected with said first power terminal, wherein said first power terminal supplies high power source voltage.

16. A flash controller in accordance with claim 8, further comprising a regenerative diode having an cathode connected with said gate of said insulated gate semiconductor device and an anode connected with said second power terminal, wherein said second power terminal supplies low power source voltage.

* * * * *